(12) United States Patent
Lin (10) Patent No.: US 8,033,855 B2
(45) Date of Patent: Oct. 11, 2011

(54) BURN-IN SOCKET CONNECTOR

(75) Inventor: Wei-Chih Lin, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/858,794

(22) Filed: Aug. 18, 2010

(65) Prior Publication Data

US 2011/0045682 A1 Feb. 24, 2011

(51) Int. Cl.
*H01R 13/62* (2006.01)
(52) U.S. Cl. .................................................... 439/331
(58) Field of Classification Search .................. 439/331, 439/73, 330, 525, 526
See application file for complete search history.

(56) References Cited

U.S. PATENT DOCUMENTS

| | | | |
|---|---|---|---|
| 4,846,703 A * | 7/1989 | Matsuoka et al. | 439/71 |
| 6,768,653 B2 * | 7/2004 | Ohashi | 361/807 |
| 7,491,082 B2 | 2/2009 | Hsu et al. | |
| 7,866,987 B2 * | 1/2011 | Chen | 439/73 |
| 2007/0281509 A1 * | 12/2007 | Chen | 439/73 |
| 2010/0035447 A1 | 2/2010 | Chen et al. | |

* cited by examiner

*Primary Examiner* — Tho D Ta
*Assistant Examiner* — Travis Chambers
(74) *Attorney, Agent, or Firm* — Wei Te Chung; Andrew C. Cheng; Ming Chieh Chang (57) ABSTRACT

A socket connector (100) includes a base (1) defining a receiving room, an insulative housing (2) received in the receiving room, a number of contacts (6) retained in the insulative housing, a floating plate (3) secured to the base and attached to an upper face of the insulative housing, and a number of springs (7). The insulative housing includes a first block portion (22), a second block portion (21) located upon the first block portion, and a side shoulder (23). The floating plate includes a rectangular main portion (30) and a plurality of fixing legs (31) extending from corners of the main portion towards the base. The springs have a first group of springs sandwiched between the edges of the main portion and the base, and a second group of springs sandwiched between the fixing legs and the side shoulder of the insulative housing.

14 Claims, 7 Drawing Sheets

BURN-IN SOCKET CONNECTOR

BACKGROUND OF THE INVENTION

1. Field of the Invention

The present invention relates generally to a burn-in socket connector, and more particularly to a burn-in socket connector which is durable in use.

2. Description of Related Arts

Electronic packages, such as integrated circuit (IC) packages, are miniaturized electronic devices in which a number of active and passive circuit elements are located on or within a continuous body of material to perform the function of a complete circuit. To ensure reliability in use, the IC packages require prior burning in to test their durability. The IC packages are operated at high temperature for an extended period of time to accelerate potential failure points. This helps eliminate early product failures once the IC packages are soldered and/or assembled onto electronic end products. Thus, a burn-in socket is used to receive the IC package, and to electrically connect the IC package with a burn-in board for operation of the IC package at a high temperature.

A traditional burn-in socket for electrically connecting an IC package usually comprises a base, a sliding plate, a pair of latches pivotally assembled on two sides of the base to position the IC package on the sliding plate, a lid mounted on the base for urging the latches and a bottom board assembled on the bottom of the base. The base has a rectangle configuration, and comprises two opposite sidewalls and a bottom wall. A cavity is defined in the center of the base for accommodating the sliding plate and the bottom board. The sidewalls have mounting holes for receiving coil springs on four corners thereof The lid abuts the coil springs and permits a loading of the IC package into the sliding plate for testing. When the operating force is released, the sliding plate will return to an initial position by the operation of the coil springs. The coil springs are merely arranged on four corners of the base and elasticity of the coil springs may deteriorate at different degrees in durable use, resulting in that the sliding plate may be imbalanced. The contacts extend beyond the sliding plate with different heights to mate with the IC package, which may cause instability of connection between the IC package and the contacts.

Hence, a burn-in socket connector durable in use with stability of connection to the IC package is desired to overcome the aforementioned disadvantage of the prior art.

SUMMARY OF THE INVENTION

Accordingly, an object of the present invention is to provide a burn-in socket connector which, even though durably used, retains stability of connection to the IC package.

To achieve the above object, a socket connector includes a base defining a receiving room, an insulative housing received in the receiving room, a number of contacts retained in the insulative housing, a floating plate secured to the base and attached to an upper face of the insulative housing, and a number of springs. The insulative housing includes a first block portion, a second block portion located upon the first block portion, and a side shoulder. The floating plate includes a rectangular main portion and a plurality of fixing legs extending from corners of the main portion towards the base. The springs have a first group of springs sandwiched between the edges of the main portion and the base, and a second group of springs sandwiched between the fixing legs and the side shoulder of the insulative housing.

Other objects, advantages and novel features of the invention will become more apparent from the following detailed description when taken in conjunction with the accompanying drawings.

DETAILED DESCRIPTION OF THE PREFERRED EMBODIMENT

Reference will now be made in detail to the preferred embodiment of the present invention.

Referring to FIGS. 1-7, a burn-in socket connector 100 in accordance with the present invention for electrically connecting an integrated circuit (IC) package (not shown) to a printed circuit board (not shown), comprises a base 1, an insulative housing 2 received in the base 1, a plurality of contacts 6 retained in the insulative housing 2, a floating plate 3 secured to the base 1 and attached to an upper face of the insulative housing 2, a plurality of springs 7 being arranged beneath the floating plate 3 for providing elasticity, an adapter 4 arranged on top of the floating plate 3 for receiving the IC package, and a lid 5 attached to one end of the base 1, pivotally rotating thereto and finally snapping to the other end of the base 1 for urging the floating plate 3 to move down and accordingly, the contacts extend out of the floating plate 3 to connect with the IC package.

Figure 3:
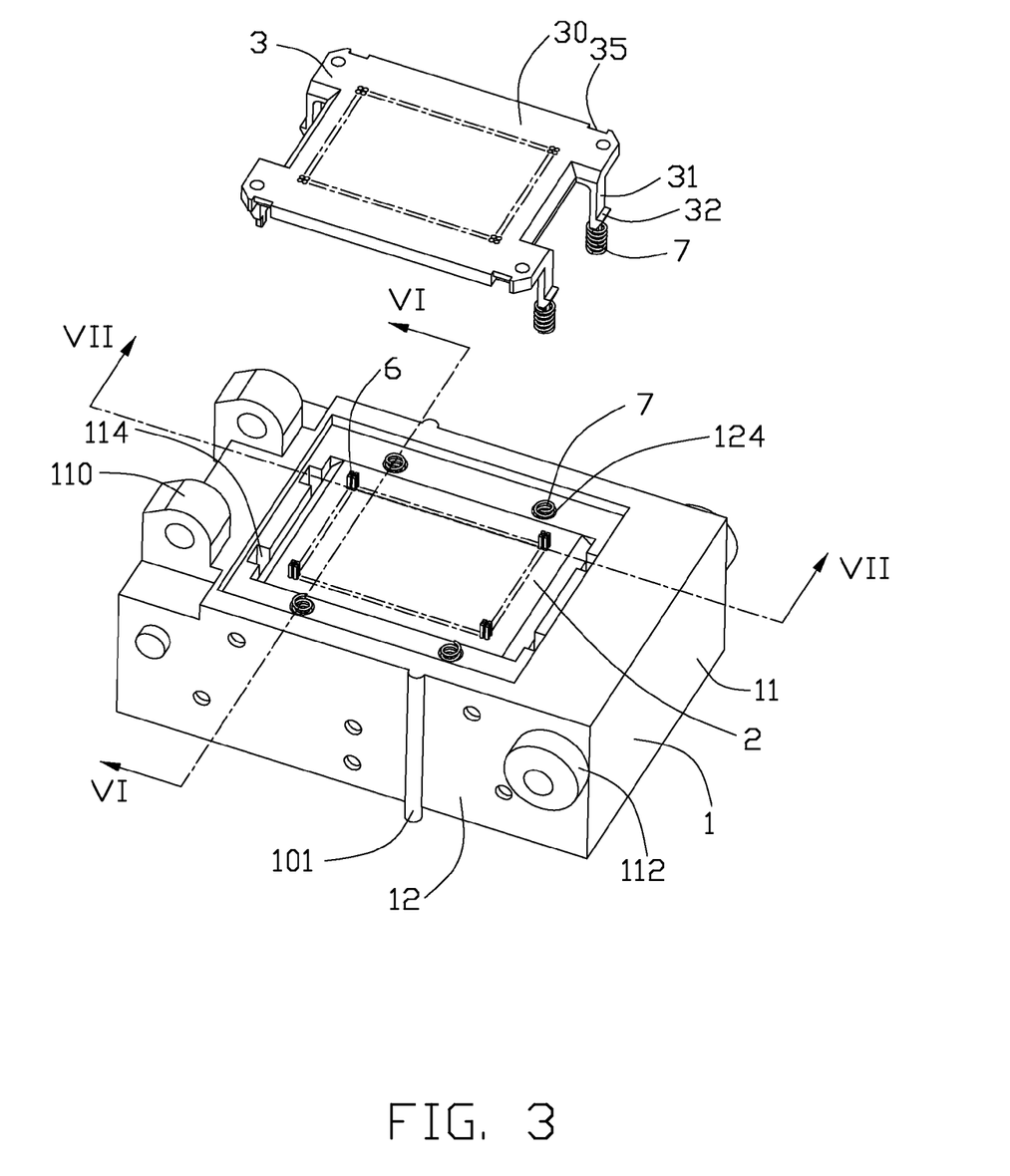
FIG. 3 is a perspective, partly exploded view of the socket connector.

Referring to FIG. 3, the base 1 is integrally formed and comprises a bottom wall 10, a pair of lateral walls 12 extending upwardly from the opposite sides of the bottom wall 10, and a pair of sleeve portions 11 connecting the lateral walls 12. The bottom wall 10, the lateral walls 12 and the sleeve portions 11 cooperatively defines a receiving room (not labeled) for the insulative housing 2. One sleeve portion 11 forms a pair of axle portions 110 protruding from the upper side thereof The other sleeve portion 11 forms a fixing portion 112 at each side thereof. The lid 5 with one end thereof is fixed to the axle portions 110 and pivotally rotates therearound and the other end thereof finally engages with the fixing portions 112 at a final estate when the IC package is loaded in the adapter 4. Each lateral wall 12 defines a plurality of through holes 122 and the through holes 122 are symmetrical relative to a central line (not shown) defined by the sleeve portions 11. Each lateral wall forms a positioning pole 101 which further extends beyond the bottom wall 10 for positioning the base 1 to the printed circuit board. The positioning poles 101 are dissymmetrical to each other with respect to the central line for distinguishingly positioning to the printed circuit board.

Figure 5:
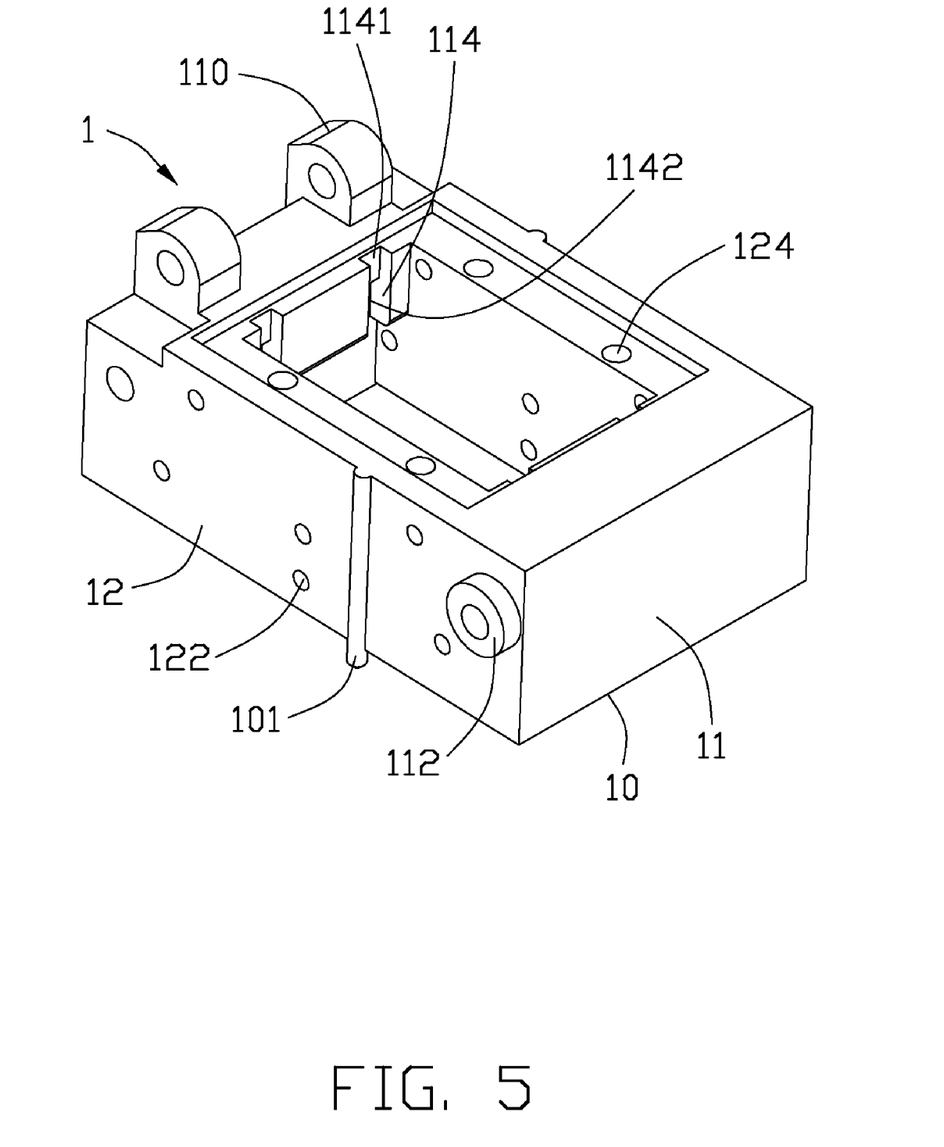
FIG. 5 is a perspective view of the insulative base.
Figure 6:
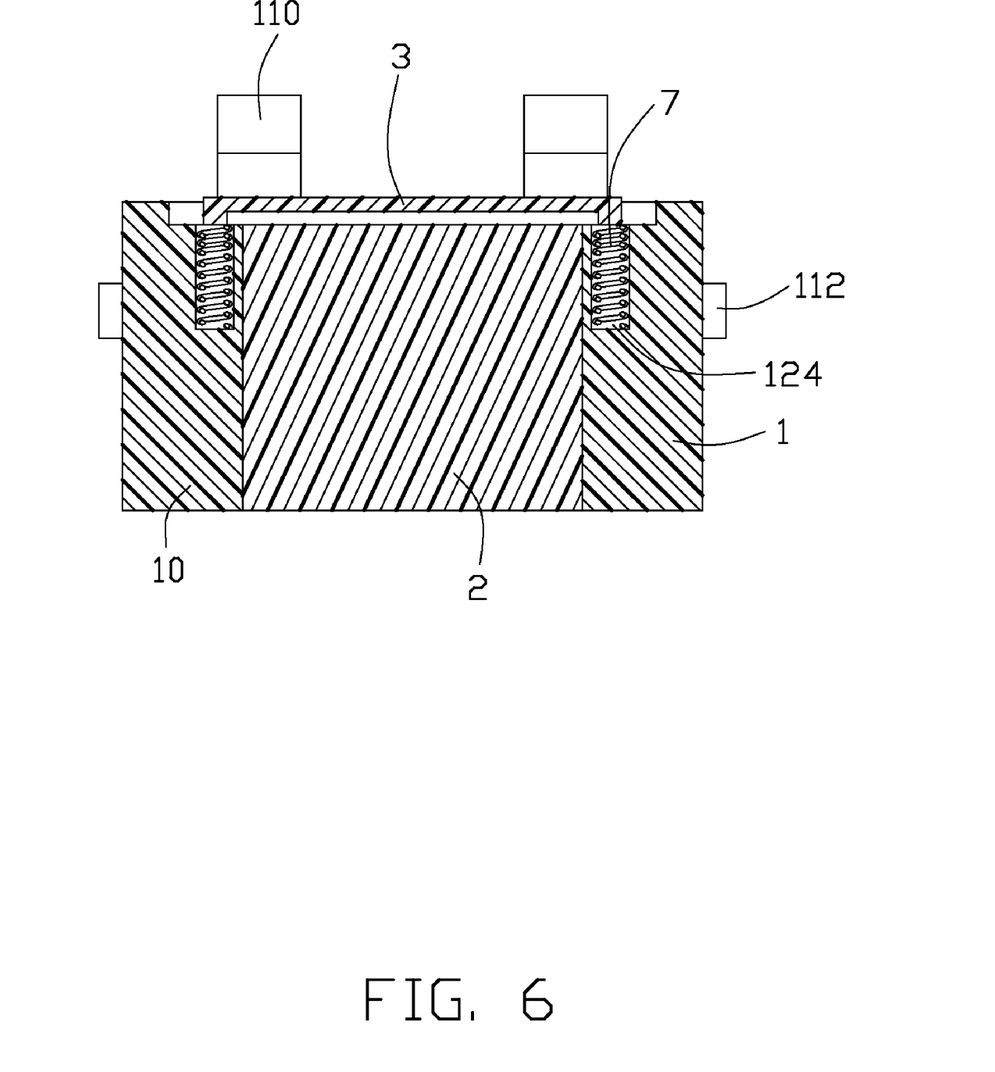
FIG. 6 is a cross-sectional view of the socket connector taken along line VI-VI of FIG. 3 without the adapter and the lid.
Figure 7:
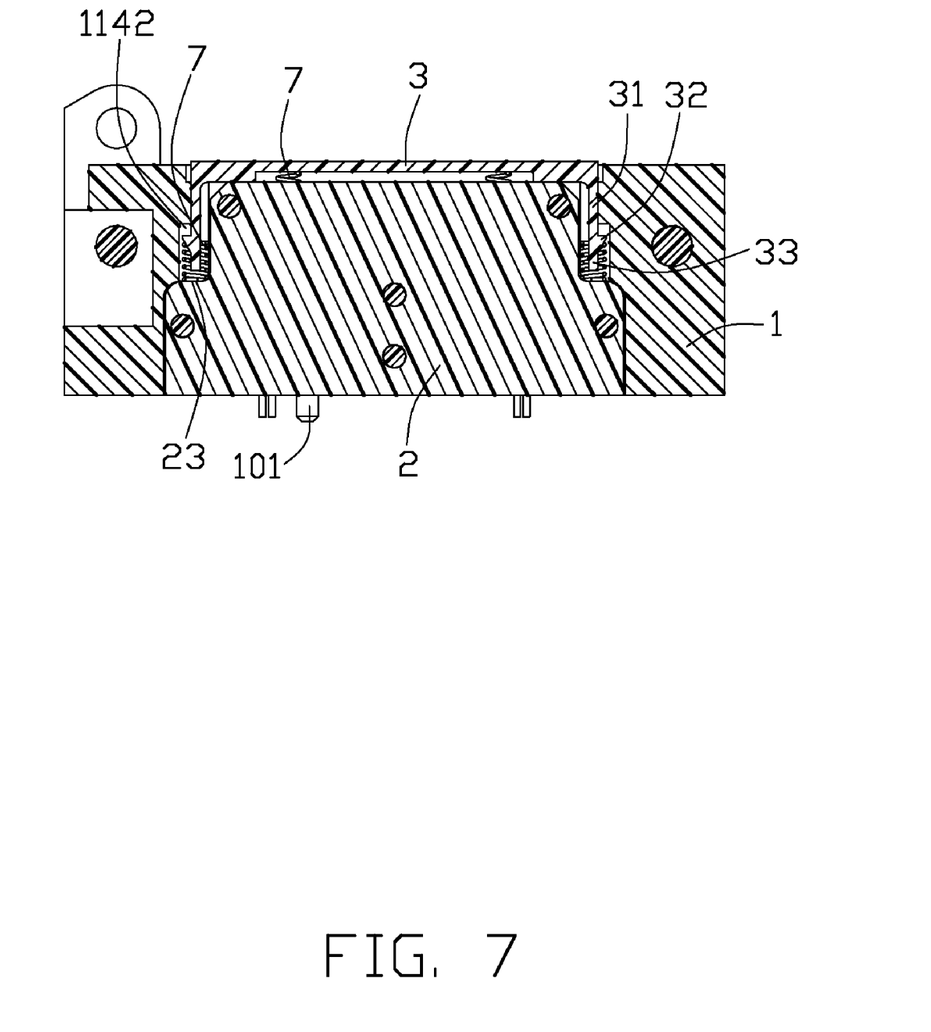
FIG. 7 is another cross-sectional view of the socket connector taken along line VII-VII of FIG. 3 without the adapter and the lid.

Referring to FIGS. 3 and 5, the base 1 defines a plurality of slots 124 from upper sides of the lateral walls 12, symmetrical to each other relative to the central line. The base 1 further comprises a pair of recesses 114 adjacent to each sleeve portion 11. The recesses 114 communicate with the receiving room and the two recesses 114 on one sleeve portion 11 faces toward the corresponding recesses 114 on the other sleeve portion 11. Each recess 114 forms a guiding portion 1141 slantwise in an upper position and an engaging portion 1142 in a lower position which is beneath the guiding portion 1141.

Referring to FIGS. 2-5, the insulative housing 2 is received in the receiving room of the base 1. The insulative housing 2 defines a plurality of passageways (not labeled) for receiving the contacts 6. The insulative housing 2 comprises a first block portion 22, a second block portion 21 located upon the first block portion 22, and side shoulders 23. Both the first block portion 22 and the second block portion 21 form a plurality of shafts 20 extending therethrough in horizontal directions. The shafts 20 are respectively and correspondingly received in the through holes 122 such that the insulative housing 2 is fixed in the base 1.

Figure 2:
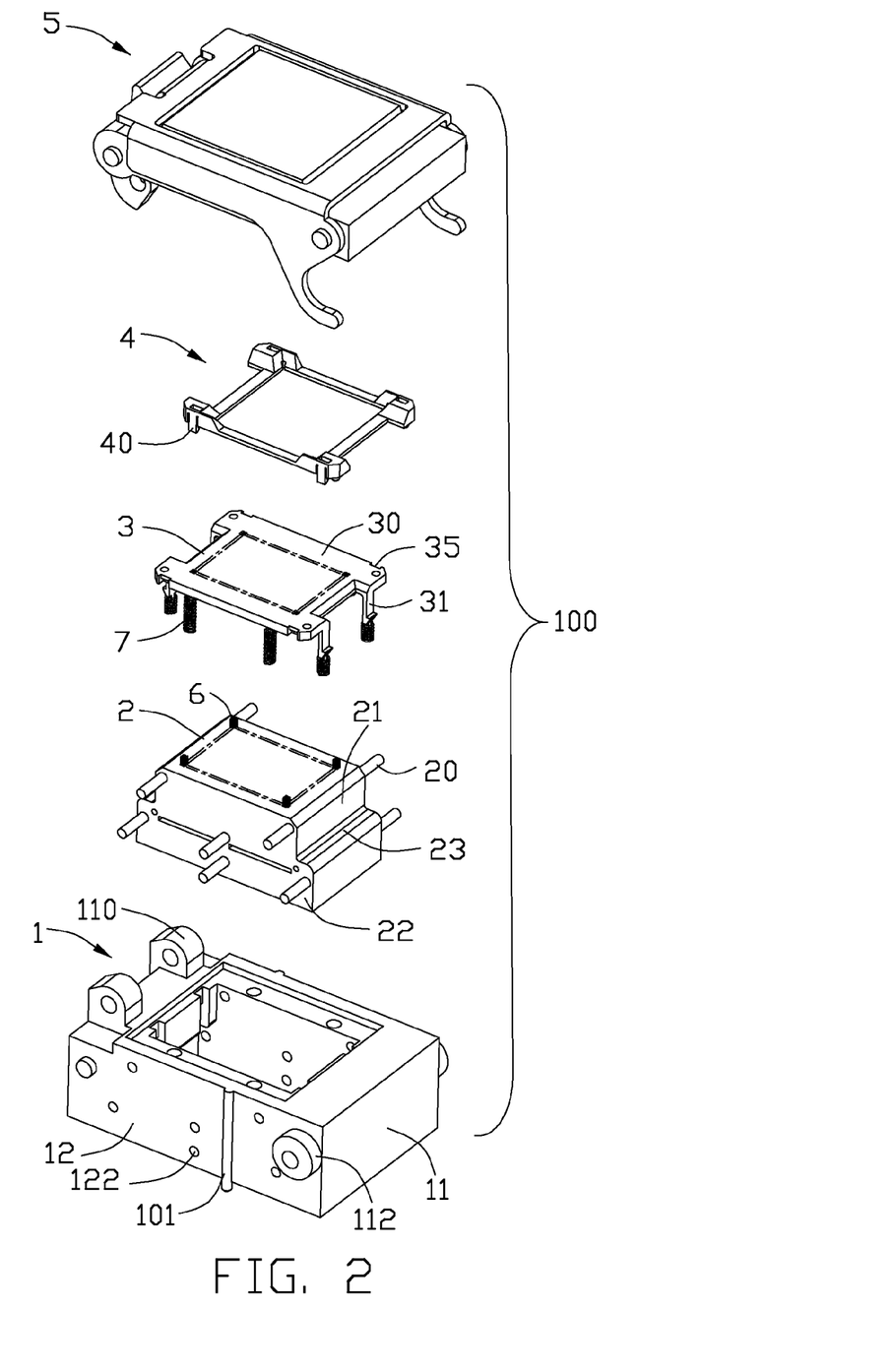
FIG. 2 is a perspective, exploded view of the socket connector.
Figure 4:
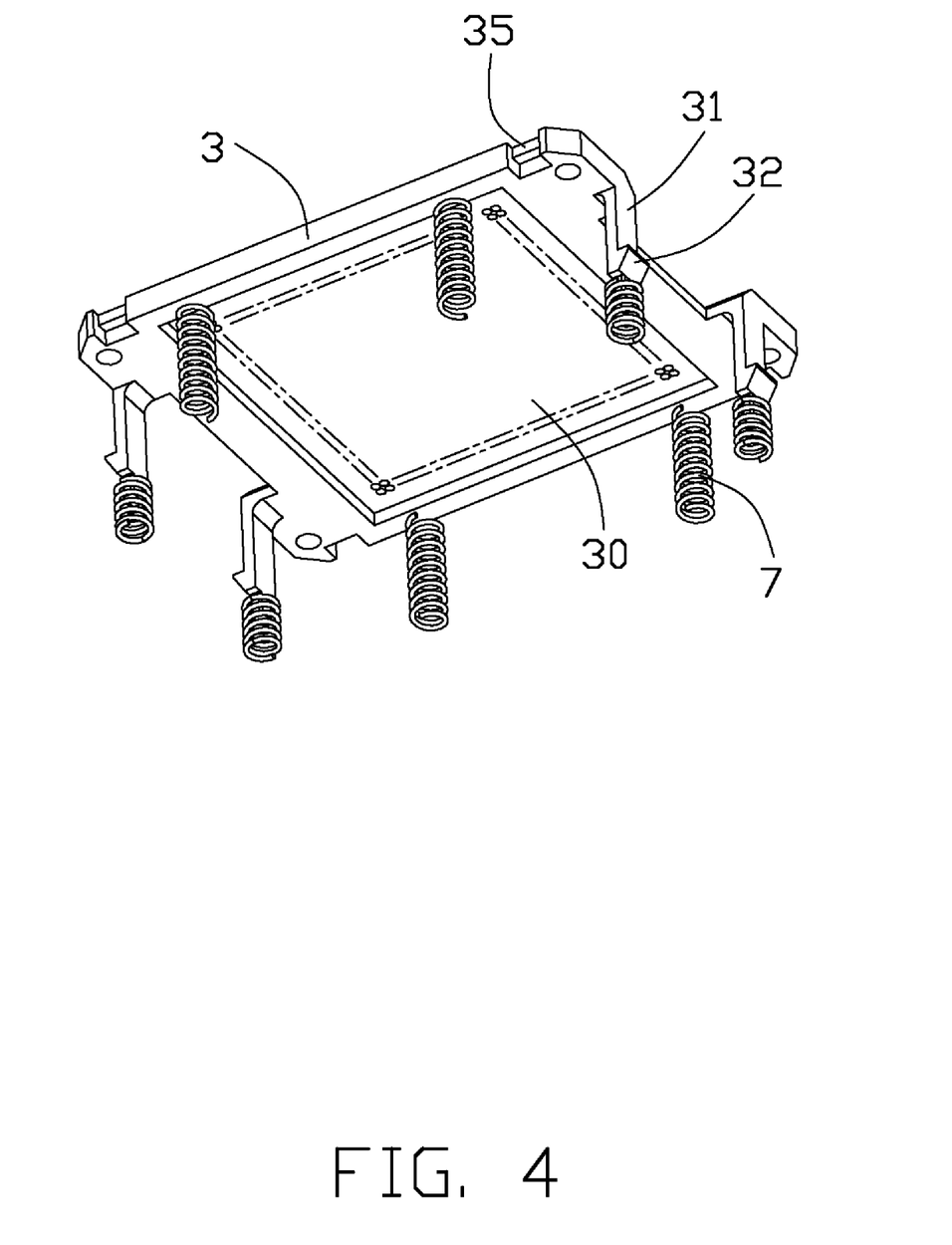
FIG. 4 is a perspective view of the floating plate and the springs.

Referring to FIGS. 2-4, the floating plate 3 is generally rectangular and comprises a main portion 30 and a plurality of fixing legs 31 extending downwardly from four corners of the main portion 30. The main portion 30 defines a plurality of openings (not labeled) aligning with the passageways of the insulative housing 2 in a vertical direction. The main portion 30 defines at least two cutouts 35 at opposite edges thereof. Each fixing leg 31 forms a hook portion 32 at a distal end thereof for engagement. Some springs 7 which are received in the slots 124 of the base 1 confront lower surfaces of the main portion at two lateral edges. The fixing legs 31 are guided by the guiding portions 1141 into the recesses 114 and finally engage with the engaging portion 1142 to secure the floating plate 3 and the base 1. Some other springs 7 each have a first end (not labeled) engaging a retention portion 33 of the fixing leg 31 and a second end (not labeled) supported by the side shoulder 23. The springs 7 are resiliently comprised either between the floating plate 3 and the base 1 or between the floating plate 3 and the insulative housing 2 so that the floating plate 3 is floated upon the insulative housing 2.

Referring to FIGS. 2-4, the adapter 4 comprises a plurality of snaps 40 inserted into the cutouts 35 of the floating plate 3, secured thereto and accordingly, the adapter 4 moves up and down accompanying with the floating plate 3. The adapter 4 is frame-shaped since the IC package received in the adapter 4 have pin legs extend below the adapter 4 to connect with the contacts 6 when the contacts 6 extend beyond the floating plate 3.

Figure 1:
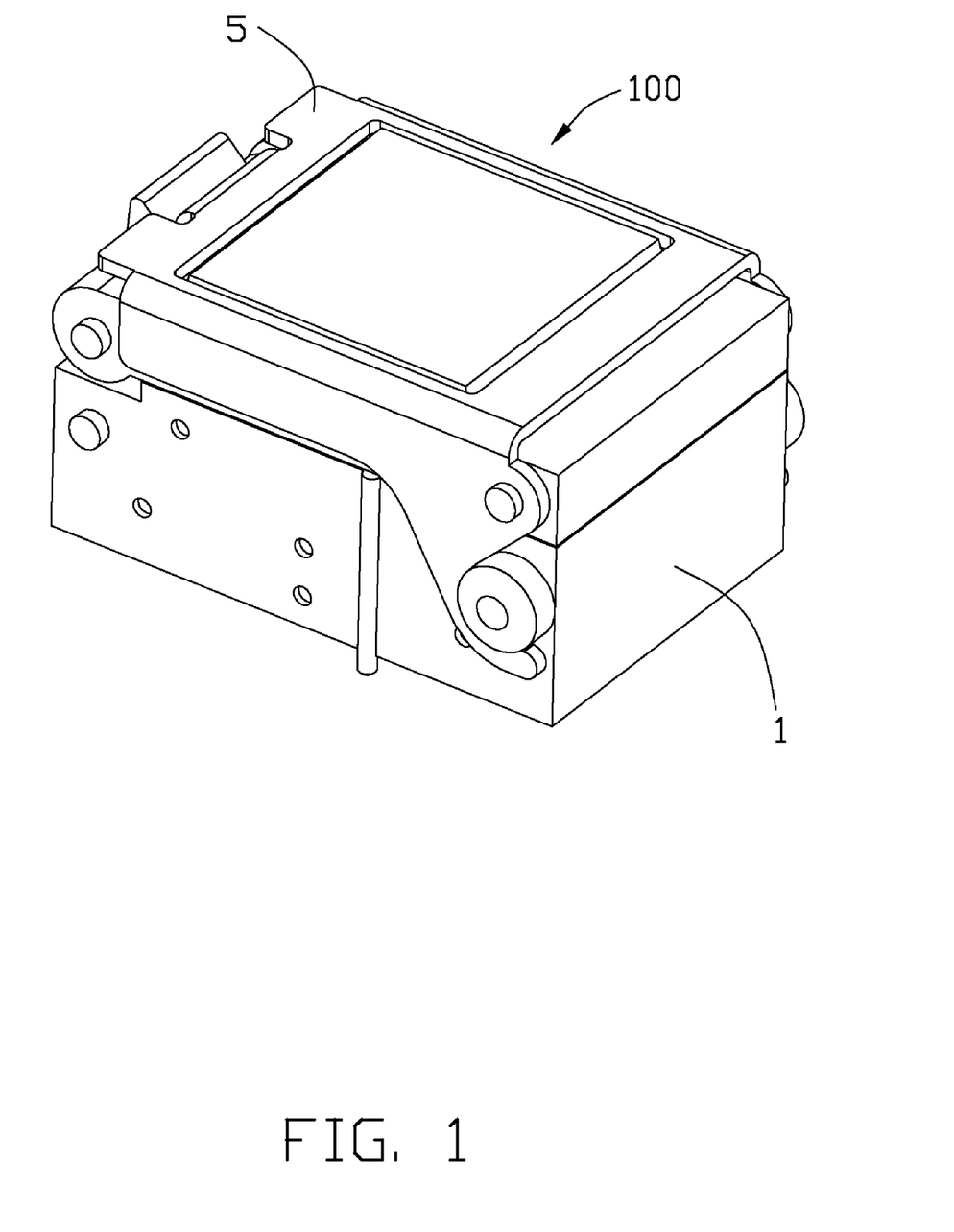
FIG. 1 is a perspective, assembled view of a socket connector constructed in accordance with the present invention.

Referring to FIGS. 1 and 2, the lid 5 is attached to the base 1 and moves between an open position at which the IC package is placed on the adapter 4 and a closed position at which the IC package is kept between the lid 5 and the adapter 4 reliably.

In the present invention, the socket connector 100 comprises a plurality of springs 7 exerting force both on the edges of the main portion 30 of the floating plate 3 and the fixing legs 31 which are formed at the corners of the floating plate 3. The present invention disperses pressure to the floating plate 3 and avoids imbalance of the floating plate 3. Finally, the socket connector 100 of the present invention can provide reliable connection between the IC package and the contacts and accordingly, for better testing the IC package.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A socket connector comprising:
a base defining a receiving room;
an insulative housing received in the receiving room, the insulative housing comprising a first block portion, a second block portion located upon the first block portion, and a side shoulder;
a plurality of contacts retained in the insulative housing;
a floating plate secured to the base and attached to an upper face of the insulative housing, the floating plate comprising a rectangular main portion and a plurality of fixing legs extending from corners of the main portion towards the base; and
a plurality of springs including a first group of springs compressed between edges of the main portion and the base and a second group of springs compressed between the fixing legs and the side shoulder of the insulative housing.

2. The socket connector as claimed in claim 1, wherein the base defines a plurality of recesses communicating with the receiving room and receiving the second group of springs.

3. The socket connector as claimed in claim 2, wherein the recesses receive the fixing legs.

4. The socket connector as claimed in claim 3, wherein the recess comprises a guiding portion and an engaging portion beneath the guiding portion, and the fixing leg is guided by the guiding portion and secured into the engaging portion.

5. The socket connector as claimed in claim 4, wherein the fixing leg has a hook portion secured in the recess and a retention portion engaging a corresponding one of the second group of springs.

6. The socket connector as claimed in claim 1, wherein the base comprises a bottom wall, a pair of lateral walls, and a pair of sleeve portions cooperatively defining the receiving room, and the base defines on the lateral walls a plurality of slots receiving the first group of springs.

7. The socket connector as claimed in claim 6, wherein the lateral wall defines a plurality of holes and the insulative housing forms a plurality of shafts received in the holes for fixing the base and the insulative housing.

8. The socket connector as claimed in claim 1, wherein the floating plate moves along a vertical direction due to elasticity of the springs.

9. The socket connector as claimed in claim 8, further comprising an adapter attached to the floating plate and moves accompanying with the floating plate.

10. The socket connector as claimed in claim 1, further comprising a lid mounted to the base for moving the floating plate.

11. The socket connector as claimed in claim 10, wherein one end of the lid is pivotally attached to the base and the other end of the lid moves between an open position and a closed position.

12. A socket connector comprising:
a base defining a receiving room with opposite front and rear ends by two opposite transverse sides of said receiving room in a front-to-back direction;
an insulative housing received in the receiving room and cooperating with base to form a spring holding area around a peripheral region;
a plurality of contacts retained in the insulative housing;
a floating plate secured to the base and attached to an upper face of the insulative housing, the floating plate comprising a rectangular main portion and a plurality of fixing legs extending downwardly therefrom towards the base adjacent to said front and rear ends; and a first group of springs located and compressible between the main portion and the spring holding area, and a second group of springs located and compressible between the fixing legs and the spring holding area.

13. The socket connector as claimed in claim 12, wherein the first group of spring are located proximate two opposite longitudinal sides of the receiving room.

14. The socket connector as claimed in claim 12, further includes a cover pivotally mounted to one of the first and second ends with a latch locked to the other of said first and second ends.

* * * * *